US006417661B1

(12) United States Patent
Berkcan et al.

(10) Patent No.: US 6,417,661 B1
(45) Date of Patent: *Jul. 9, 2002

(54) SELF POWERED CURRENT SENSOR

(75) Inventors: Ertugrul Berkcan, Niskayuna, NY (US); Raymond Kelsey Seymour, Plainville, CT (US)

(73) Assignee: General Electric Company, Schenectady, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/286,951

(22) Filed: Apr. 6, 1999

Related U.S. Application Data

(63) Continuation-in-part of application No. 08/919,639, filed on Aug. 28, 1997, now abandoned.

(51) Int. Cl.⁷ .............................................. G01R 31/00
(52) U.S. Cl. .................. 324/117 R; 324/126; 324/127
(58) Field of Search .............................. 324/117 R, 127, 324/142, 126, 130, 133

(56) References Cited

U.S. PATENT DOCUMENTS

| 2,831,164 A | * | 4/1958 | Johnson ...................... 324/127 |
| 4,021,729 A | * | 5/1977 | Hudson, Jr. ............... 324/117 R |
| 4,182,982 A | * | 1/1980 | Wolf et al. .................. 324/127 |
| 4,742,296 A | * | 5/1988 | Petr et al. ................... 324/142 |
| 4,810,989 A | * | 3/1989 | Brandenberg et al. ...... 324/127 |
| 5,027,059 A | * | 6/1991 | De Montgolfier et al. .. 324/127 |
| 5,066,904 A | * | 11/1991 | Bullock ...................... 324/127 |
| 5,587,651 A | * | 12/1996 | Berkcan et al. ............. 324/127 |

* cited by examiner

Primary Examiner—Michael J. Sherry
Assistant Examiner—Minh N. Tang
(74) Attorney, Agent, or Firm—Donald S. Ingraham; Christian G. Cabou

(57) ABSTRACT

A self powered parallel bar current sensor for generating a signal which accurately represents current in a power line includes a power coil core having an opening extending therethrough, and a current sensing element including two substantially parallel sensing bars and a sensing coil. The sensing coil is disposed between the sensing bars, and the sensing bars and sensing coil extend through the power coil core opening. A reference coil may also be situated between the sensing bars. The current sensor is connected in series in the power line.

16 Claims, 7 Drawing Sheets

SELF POWERED CURRENT SENSOR

CROSS REFERENCE TO RELATED APPLICATIONS

This application is a continuation-in-part of application is a continuation of application Serial No. 09/286,951, filed Apr. 6, 1999 which, in turn, Ser. No. 08/919,639, filed Aug. 28, 1997 now abandoned.

FIELD OF THE INVENTION

This invention relates generally to sensing power line current and, more particularly, to self powered current sensors for use in circuit breakers.

BACKGROUND OF THE INVENTION

Many electrical and electronic systems and devices include current sensors for sensing current in a conductor. For example, power distribution systems include components such as circuit breakers, transformers and power lines. A typical circuit breaker includes current sensors for identifying transients in the power line current and controls for determining when to trip, i.e., open, a particular branch of the system. More specifically, the power line carries an input current $I_{in}$. A current sensor or comparator senses the input current and provides a scaled output current $I_{out}$ having a magnitude proportional to, but many magnitudes lower than, the input current. Scaled output current $I_{out}$ is used to identify transients and to determine when to trip the system.

A known current sensor, also referred to herein as a comparator, includes a current transformer having a core of magnetic material and secondary windings. Each winding has a large number of turns of fine gauge wire evenly distributed around the core. The core encircles the power line carrying input current $I_{in}$.

In operation, an alternating magnetic flux from the power line carrying current $I_{in}$ is induced in the current comparator core. A voltage is therefore induced in the secondary windings of the comparator and is provided to, for example, a high gain differential amplifier. The amplifier output signal is supplied to a feedback winding to obtain a condition of zero-flux in the core. The current in the feedback winding is then the scaled output current $I_{out}$.

Accurate current sensing is often required in, for example, circuit breaker applications in which digital display and metering is employed. Inaccurate current sensing could lead, for example, to unnecessarily cutting-off power to a load and power metering discrepancies, which are undesirable. Although the above known sensor provides acceptable results, it would be desirable to improve the sensing accuracy of the sensor while reducing its cost.

In addition to high accuracy and low cost, the physical size of current sensors is often important. For example, if products must be redesigned in order to incorporate a new current sensor, the cost of adding the new current sensor to the product can be very expensive. Preferably, any new current sensor is sized so that it can be easily installed into existing units, such as circuit breakers.

Further, since many power system components preferably are not battery driven, the current sensor also is preferably self powered. This generally means that any power required by the current sensing circuit and other electronic components in the breaker unit must be provided by the power line being monitored. Use of a battery would not only add to the cost of the sensor but also the power system components would be constrained to rely on battery power to provide protection in the event of an overcurrent condition requiring the breaker to trip. By providing a self powered current sensor, these added disadvantages can be avoided and high reliability can be achieved.

It would be desirable, therefore, to provide a current sensor sized so that it can be used in existing units, such as circuit breakers. Such a current sensor must also provide high accuracy, to sense current in a power line, and preferably be self-powered.

SUMMARY OF THE INVENTION

A self powered parallel bar current sensor for generating a signal which accurately represents current flowing through a power line includes, in one embodiment, a power coil with a core of magnetic material having an opening extending therethrough, and a current sensing element. A power coil is wrapped, or wound, on the power coil core. The current sensing element includes two sensing bars and a sensing coil. The sensing bars are substantially parallel to each other with the sensing coil disposed therebetween. The sensing bars and sensing coil extend through the power coil core opening.

To monitor the current in a power line, the power line is electrically coupled to the parallel sensing bars. The magnetic field then generated by current in the parallel bars induces a voltage in the current sensing coil and a current in the power coil. The induced voltage in the current sensing coil, which is proportional to the time rate of change of the current in the power conductor, is provided to a sensing circuit which then generates an output signal representative of the power conductor current.

The induced current in the power coil is used to energize the sensing circuit components as well as any additional components. For example, the power coil may be electrically connected to a power rectifier and control circuit that are connected to supply power to other components of the unit.

The current sensor of the invention provides a signal that accurately represents current in a power conductor, and yet requires low material and assembly cost. The parallel sensing bars each contribute to generation of flux in the power coil core, thus providing ample current generation for self powering. The power coil effectively shields the sensing coil from external interferences while the field generated by the parallel bars changes by 180 degrees over a short distance, thus providing further protection from external interferences.

DETAILED DESCRIPTION OF THE DRAWINGS

Figure 1:
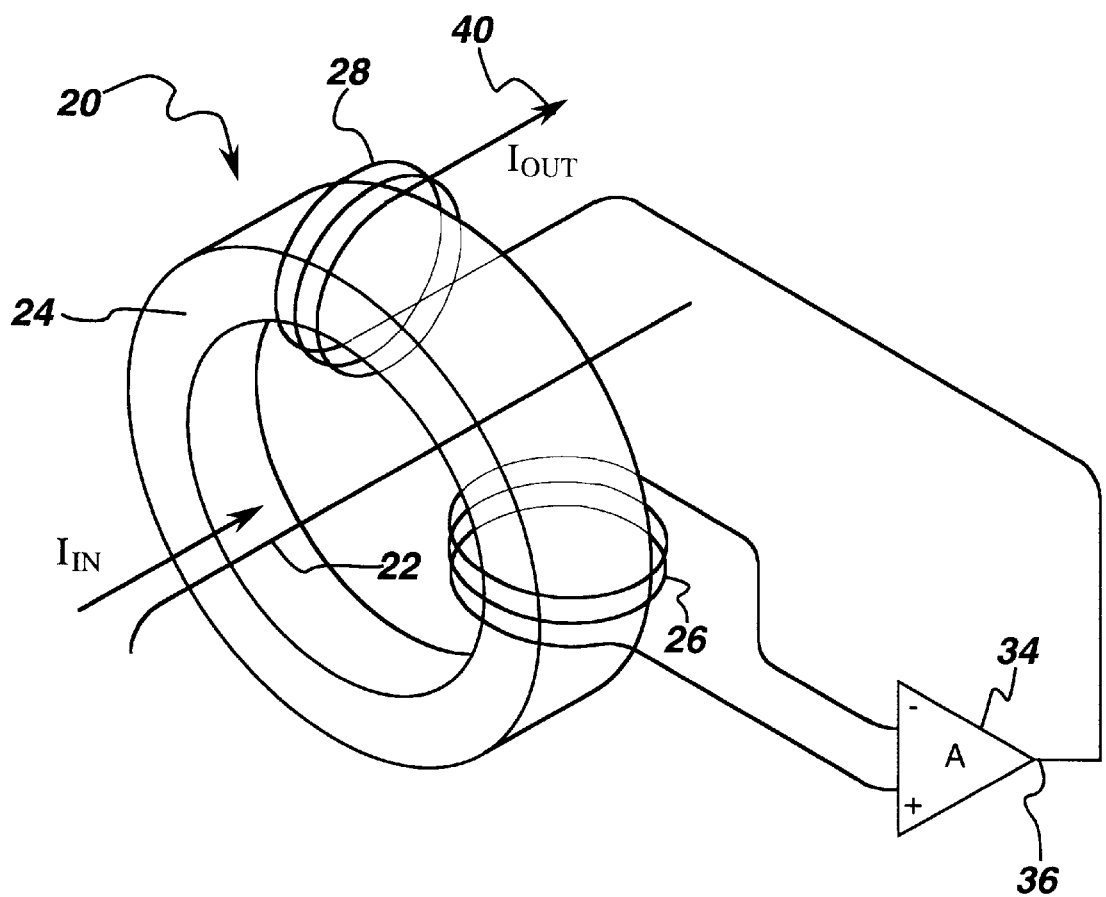
FIG. 1 is a simplified electrical schematic diagram of a known current sensor and a current-carrying element.

FIG. 1 illustrates a known current sensor 20 operating with a current-carrying element 22. A core 24 of magnetic material is wound with first secondary windings 26 and second secondary windings 28, each winding comprised of a large number N of turns of fine gage wire evenly distributed around the core. The core encircles current-carrying element 22, which serves as a single turn primary winding for current sensor 20.

Current sensor 20 scales an input current $I_{in}$ by sensing current $I_{in}$ in current-carrying element 22 and provides a fully scaled output current or signal $I_{out}$ having a magnitude proportional to, but many magnitudes lower than, input current $I_{in}$. More particularly, an alternating magnetic flux from current-carrying element 22 is induced in core 24. A voltage is therefore induced in winding 26 to generate an input signal which is provided to negative (−) and positive (+) input terminals of a high gain differential amplifier 34.

An output terminal 36 of amplifier 34 is connected to one end of secondary winding 28, which functions as a compensation or feedback winding. An output current $I_{out}$ from amplifier 34 is provided through winding 28 to an output terminal 40. The direction of current in winding 28 is such as to induce a compensating flux from winding 28 in core 24 that reduces the alternating flux in core 24 toward zero. Current sensor 20 and amplifier 34 operate dynamically to keep the alternating magnetic flux in core 24 at a very low value approaching zero. As a result, the magnetizing ampere turns resulting from measured or sensed current $I_{in}$ in the single turn primary winding (formed by current-carrying element 22) of core 24 are balanced by the magnetizing ampere turns resulting from current $I_{out}$ in the N-turn secondary winding 28. Since the transformer ampere turns are equal, or balanced, then:

$$N * I_{out} = I_{in} * 1 \quad (1a)$$

$$I_{out} = \frac{I_{in}}{N}. \quad (1b)$$

The output signal $I_{out}$ of current sensor 20 is thus a scaled version of the input alternating current $I_{in}$ where the final scaling factor is the product of two independent scale factors determined by a number of turns N in the output or secondary winding 28.

Figure 2:
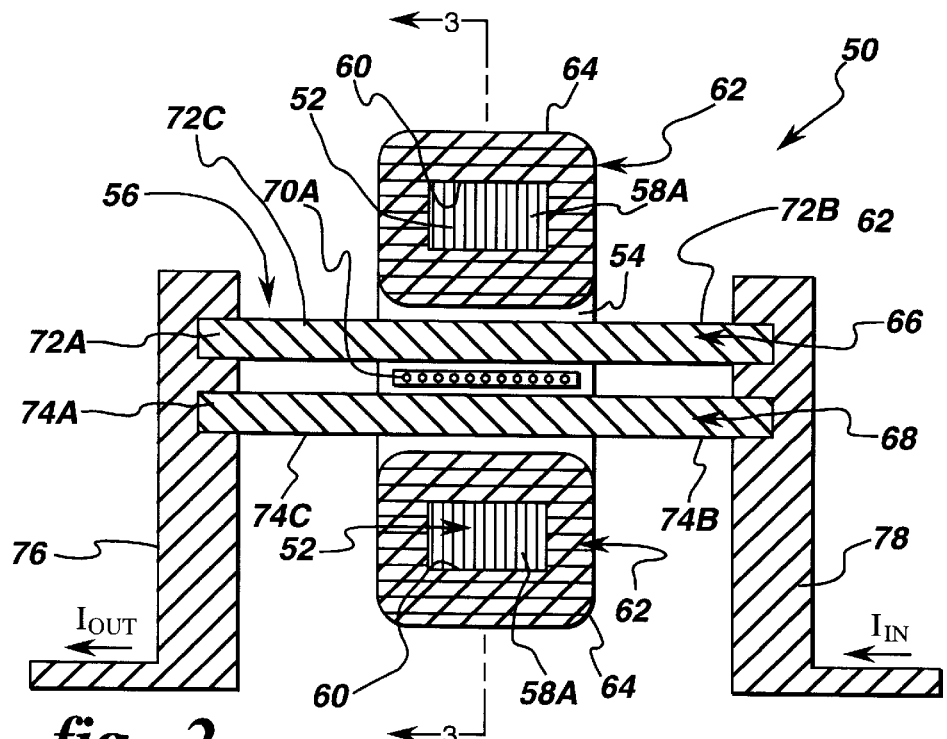
FIG. 2 is a cross sectional view of a self powered parallel bar current sensor in accordance with one embodiment of the present invention.

FIG. 2 illustrates a self powered parallel bar current sensor 50 in accordance with one embodiment of the invention. Current sensor 50 includes a power coil core 52 of magnetic material having a power coil core opening 54 extending therethrough, and a current sensing element 56. Power coil core 52 includes separate c-cores 58A and 58B (only c-core 58A is visible in FIG. 2) held together by aluminum or other non-magnetic material straps (not shown). C-cores 58A and 58B are formed, for example, of a plurality of iron laminations, and extend through longitudinal bores 60 in power coil bobbins 62. Power windings 64 are shown on power coil bobbins 62 forming a power coil. Power coil bobbins 62 are formed of electrically insulating material such as plastic.

Current sensing element 56 includes two sensing bars 66 and 68 and two sensing coils 70A and 70B (only sensing coil 70A is shown in FIG. 2). Sensing bar 66 has first and second ends 72A and 72B, respectively, and an intermediate portion 72C extending therebetween. Similarly, sensing bar 68 has first and second ends 74A and 74B, respectively, and an intermediate portion 74C extending therebetween. Current sensing element 56 is configured so that sensing bars 66 and 68 are substantially parallel to each other with sensing coils 70A and 70B disposed between intermediate portions 72C and 74C of bars 66 and 68, respectively. Sensing coils 70A and 70B similarly are substantially parallel to each other.

Sensing bars 66 and 68 and sensing coils 70A and 70B extend through power coil core opening 54. Respective first ends 72A and 74A of bars 66 and 68 are electrically connected to a conductor bar 76 and respective second ends 72B and 74B of bars 66 and 68 are electrically connected to a conductor bar 78. Each conductor bar 76 and 78 is also connected to, for example, a respective power line conductor (not shown in FIG. 2) so that the parallel combination of bars 66 and 68 is electrically in series with the power line. Consequently, conductor bar 78 supplies an input current $I_{in}$ from the power line to current sensor 50, while conductor bar 76 returns an output current $I_{out}$ from the current sensor to the power line. Sensing element 56 thus serves as a primary winding for current sensor 50.

Figure 3:
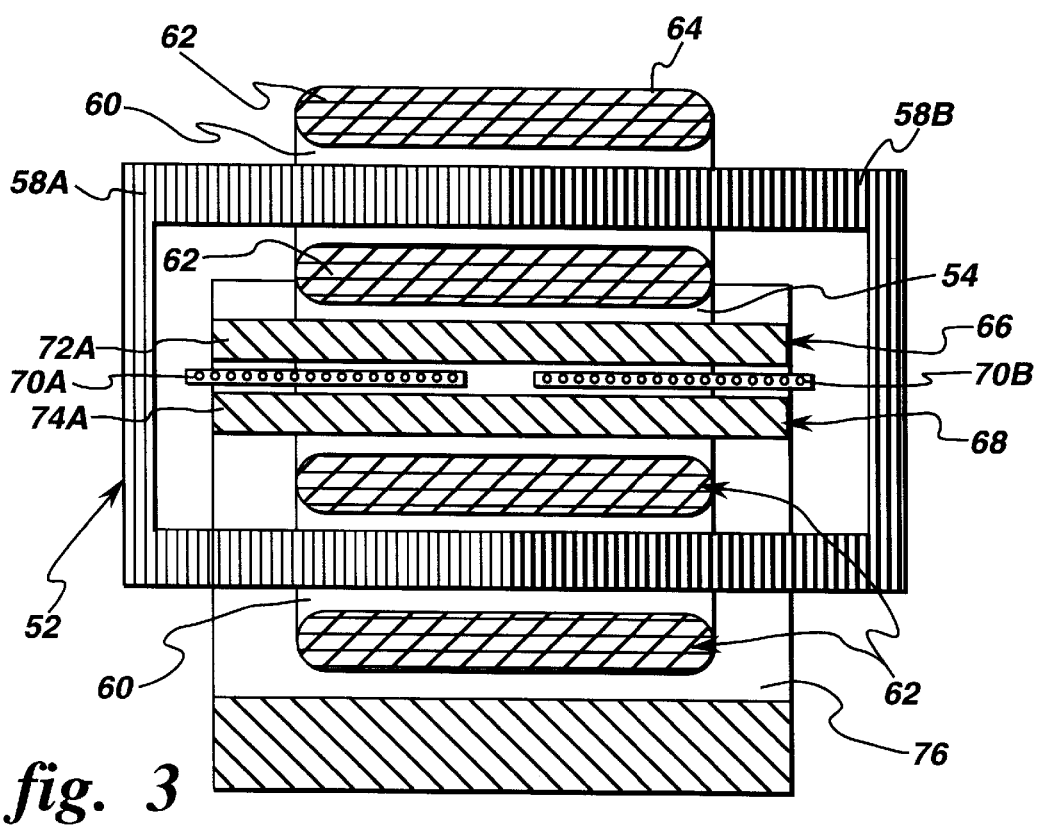
FIG. 3 is a cross sectional view of the self powered parallel bar current sensor taken through line 3—3 in FIG. 2.

As can be seen in FIG. 3, a stack of steel c-core laminations making up c-cores 58A and 58B is shown extending through bores 60 in power coil bobbins 62. The laminations of c-cores 58A and 58B are secured together by aluminum or other non-magnetic straps. Sensing coils 70A and 70B are positioned between bars 66 and 68. Coils 70A and 70B are supported, for example, by a plastic end (not shown) that locks against power coil core 52.

Figure 4:
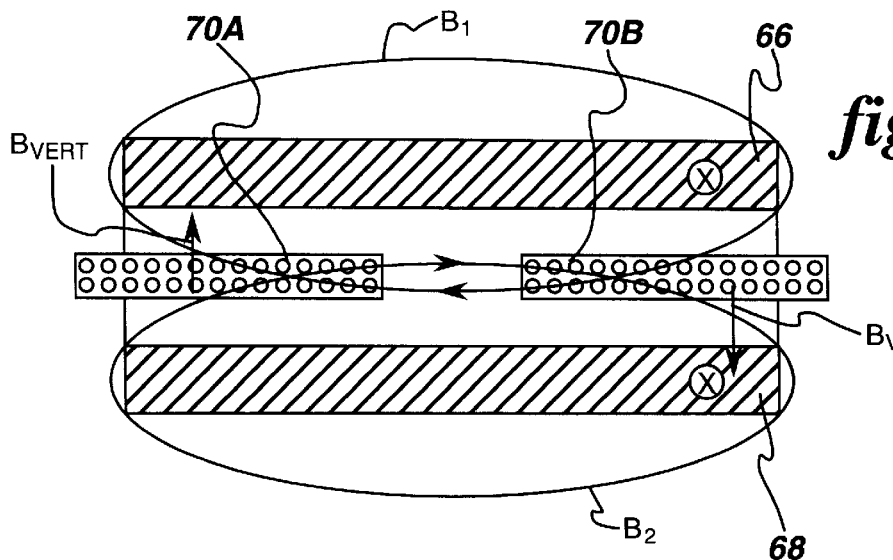
FIG. 4 is a cross sectional view of the parallel bars taken through line 3—3 in FIG. 2.

FIG. 4 is a cross sectional view of parallel bars 66 and 68 and sensing coils 70A and 70B taken through line 3—3 in FIG. 2. Current in bars 66 and 68 generates magnetic fields $B_1$ and $B_2$, respectively. Magnetic fields $B_1$ and $B_2$ combine to generate substantially opposing vertical magnetic fields $B_{vert}$ which are substantially proportional to the input current $I_{in}$. Voltages of opposite polarity are produced in sensing coils 70A and 70B since magnetic fields $B_{vert}$ are directed substantially opposite to each other. Accordingly, sensing coils 70A and 70B are connected in a series subtracting configuration so that the voltages of opposite polarity generate a larger voltage than would be obtained by a single sensing coil, i.e. 70A or 70B, that is situated in either half of the sensing element.

Figure 12:
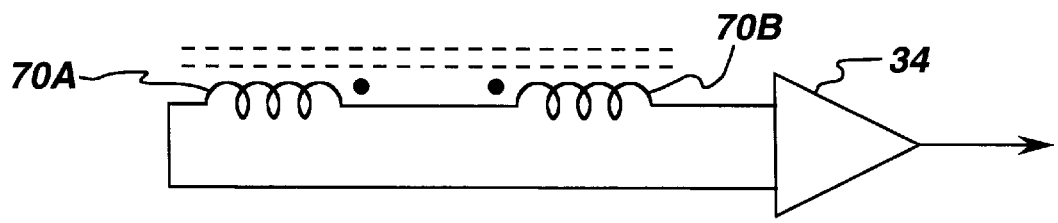
FIG. 12 is a circuit schematic diagram of the self-powered parallel bar current sensor shown in FIG. 3.

To monitor the current in a power line with the current sensor 50, the power line is electrically coupled to conductor bars 76 and 78 such that sensor 50 is electrically connected in series with the power line. The magnetic field generated by the power line current in parallel bars 66 and 68 induces a voltage in power windings 64 (FIGS. 2 and 3 ) and in current sensing coils 70A and 70B. The voltage induced in current sensing coils 70A and 70B is provided to a sensing circuit (not shown) which generates an output signal useful for controlling the power system. The sensing circuit may include, for example: an integrator and a high gain differential amplifier such as amplifier 34 shown in FIG. 1. FIG. 12 is a circuit schematic diagram showing the interconnection of coils 70A and 70B of FIG. 3 with amplifier 34.

The induced current in power windings 64 is used to energize the sensing circuit components. For example, power windings 64 may be electrically connected to a power rectifier and control circuit, the output of which may be connected to supply power to other components of the circuit.

In current sensor 50, the sensing and self powering functions are separated in order to facilitate high accuracy current sensing at low cost. Power coil core 52 is a saturable core, which prevents overcurrent generation and enables reduced power consumption by the circuit breaker in which it may be employed. By locating sensing coils 70A and 70B within parallel bars 66 and 68, and within the c-cores 58A and 58B magnetic cross-talk and magnetic coupling to external fields are minimized.

In alternative embodiments of self powered current sensors in accordance with the present invention, each sensor includes two parallel sensing bars with at least one sensing coil positioned between the sensing bars, are described below. The sensing bars are configured to be electrically connected in series with a power line to monitor current as described above.

Figure 5:
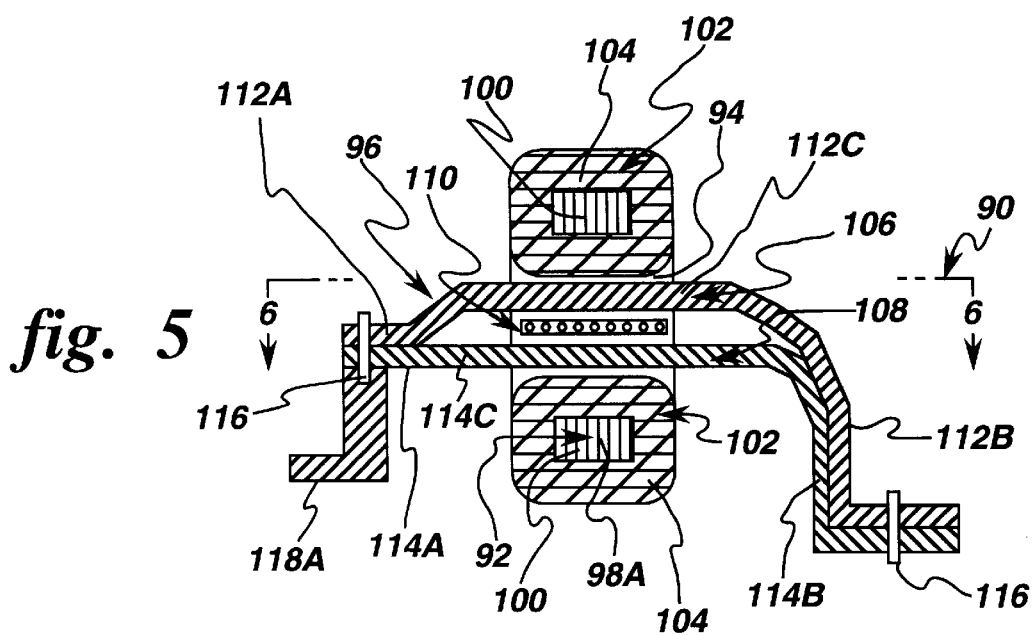
FIG. 5 is a side cross sectional view of a self powered parallel bar current sensor in accordance with another embodiment of the present invention.

In FIG. 5, a current sensor 90 includes a power coil core 92 of magnetic material having a power coil core opening 94 extending therethrough, and a current sensing element 96. Power coil core 92 includes separate c-cores 98A and 98B (only c-core 98A is visible in FIG. 5) held together by aluminum or other non-magnetic material straps (not shown). C-cores 98A and 98B are formed, for example, of a plurality of iron laminations, and extend through longitudinal bores 100 in power coil bobbins 102. Power windings 104 are shown on power coil bobbins 102 forming a power coil. Power coil bobbins 102 are formed of electrically insulating material such as plastic.

Current sensing element 96 includes two sensing bars 106 and 108 extending through power coil core opening 94, and a sensing coil 110. Sensing bar 106 has a first end 112A, a second end 112B, and an intermediate portion 112C extending between ends 112A and 112B. Similarly, sensing bar 108 has a first end 114A, a second end 114B, and an intermediate portion 114C extending between ends 114A and 114B. Current sensing element 96 is configured so that sensing bars 106 and 108 are connected in parallel with each other, with sensing coil 110 disposed between intermediate portions 112C and 114C of bars 106 and 108, respectively. Respective first ends 112A and 114A and respective second ends 112B and 114B of sensing bars 106 and 108 are electrically connected so that intermediate portions 112C and 114C of sensing bars 106 and 108 are substantially parallel to each other. Sensing bars 106 and 108 may be formed, for example, from a flat material which is bent or extruded to a desired shape, and suitably fastened, e.g., with aluminum straps 116, at respective ends 112A, 114A, 112B and 114B.

Sensing coil 110 is supported, for example, by an insulating member (not shown) coupled to power core 92. First ends 112A and 114A of bars 106 and 108 are electrically connected to a conductor bar 118A and second ends 112B and 114B of bars 106 and 108 are similarly connected to another conductor bar 118B (not shown in FIG. 5), electrically connected to the power line. Conductor bar 118A and 118B are connected to, for example, a power line (not shown in FIG. 5) such that the parallel combination of bars 106 and 108 is electrically connected in series with the power line. Sensing element 96 thus serves as a primary winding for current sensor 90.

Figure 6:
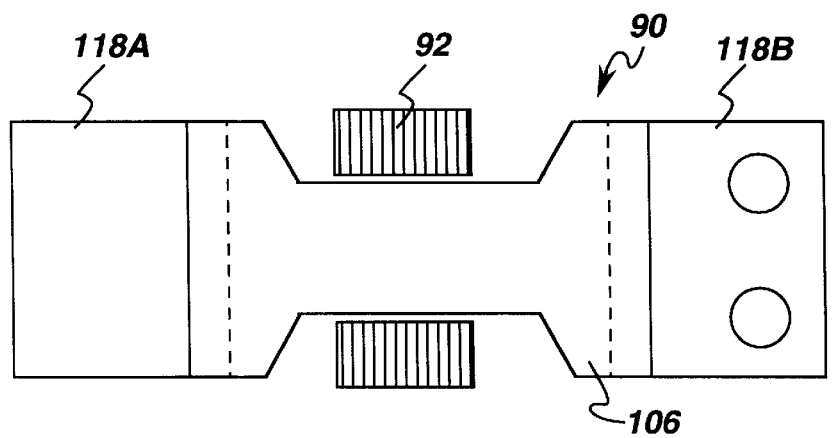
FIG. 6 is a top view of the self powered parallel bar current sensor shown in FIG. 5, taken along line 6—6.

FIG. 6 is a top view of self powered parallel bar current sensor 90, taken along line 6—6 in FIG. 5. As shown, substantially parallel conductor bars 118A and 118B are connected to respective ends 112A and 112B of sensing bar 106 which extends through power coil opening 94. Sensing bar 108 (not shown in FIG. 6) is similarly secured to conductor bars 118A and 118B and extends through power coil opening 94.

To monitor current in a power line with current sensor 90, the power line is electrically coupled to conductor bars 118A and 118B so that sensor 50 is electrically connected in series with the power line. The magnetic field generated by current in parallel bars 106 and 108, shown in FIG. 5, induces a voltage in power windings 104 and in current sensing coil 110. The voltage induced in current sensing coil 110 is provided to a sensing circuit (not shown) which generates an output signal that may be used for controlling the power system. The sensing circuit may include, for example; an integrator and a high gain differential amplifier such as amplifier 34 shown in FIG. 1.

In current sensor 90, as in current sensor 50, the sensing and self powering functions are separated in order to facilitate high accuracy current sensing at low cost. Power coil core 92 is a saturable core which prevents overcurrent generation and enables reduced power consumption by the circuit breaker in which it may be employed. By locating sensing coil 110 within parallel bars 106 and 108, and within the c-cores 98A and 98B magnetic cross-talk and magnetic coupling to external fields are minimized.

Figure 7:
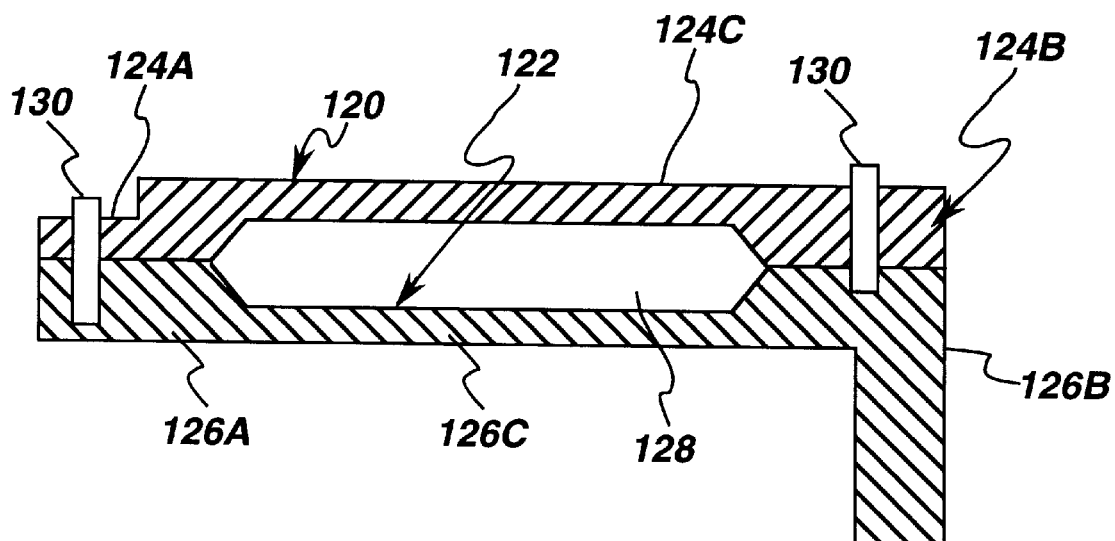
FIG. 7 is a side cross sectional view of parallel sensing bars in accordance with yet another embodiment of the present invention.

FIG. 7 illustrates another embodiment of the invention wherein a sensing bar 120 has a first end 124A, a second end 124B, and an intermediate portion 124C extending between ends 124A and 124B, and another sensing bar 122 has a first end 126A, a second end 126B, and an intermediate portion 126C extending between ends 126A and 126B.

Respective first ends 124A and 126A and respective second ends 124B and 126B of sensing bars 120 and 122 are electrically connected such that intermediate portions 124C and 126C of sensing bars 120 and 122 are substantially parallel with a gap 128 therebetween. Nonmagnetic straps 130, such as aluminum straps, connect the respective ends 124A, 126 A, 124B and 126B. Gap 128 is sized so that a sensing coil (not shown in FIG. 7) may be disposed between intermediate portions 124C and 126C of sensing bars 120 and 122.

Figure 8:
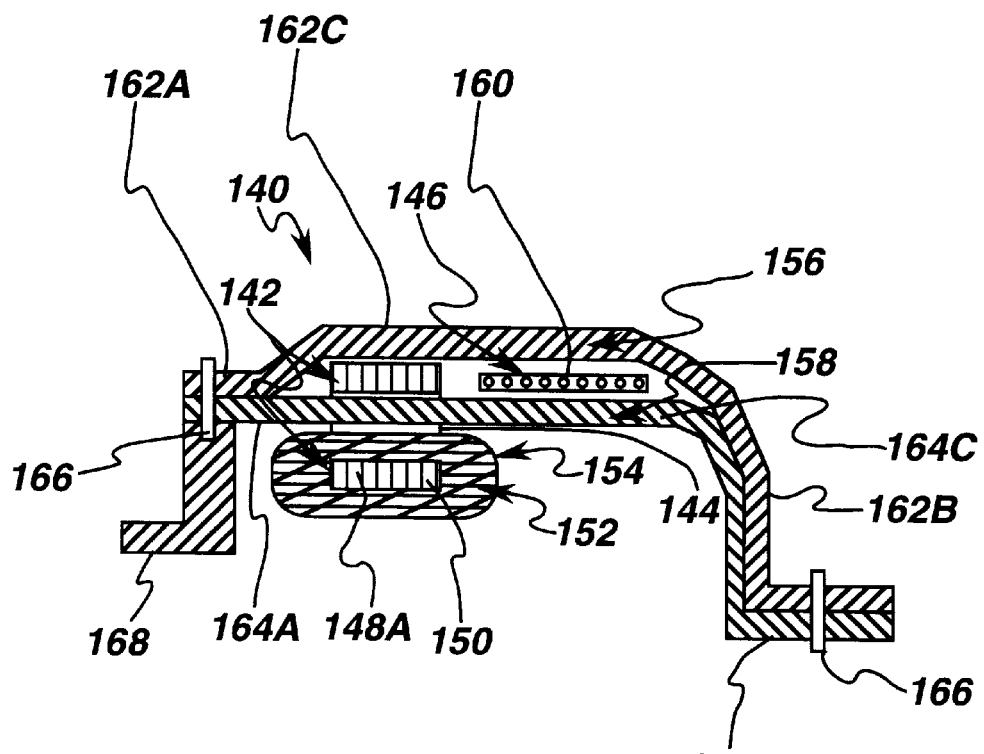
FIG. 8 is a partial side cross sectional view of a self powered parallel bar current sensor in accordance with still another embodiment of the present invention.

FIG. 8 illustrates a self powered parallel bar current sensor 140 in accordance with still another embodiment of the invention. Current sensor 140 includes a power coil core 142 of magnetic material having a power coil core opening 144 extending therethrough, and a current sensing element 146. Power coil core 142 includes separate c-cores 148A and 148B (only c-core 148A is visible in FIG. 8) held together by aluminum or other non-magnetic material straps (not shown). C-cores 148A and 148B may be formed of a plurality of iron laminations, and extend through longitudinal bores 150 in power coil bobbins 152. Power windings 154 on power coil bobbins 152 form a power coil. Power coil bobbins 152 are formed of electrically insulating material, such as plastic.

Current sensing element 146 includes two sensing bars 156 and 158 and a sensing coil 160. Sensing bar 156 has a first end 162A, a second end 162B, and an intermediate portion 162C extending between ends 162A and 162B. Similarly, sensing bar 158 has a first end 164A, a second end 164B, and an intermediate portion 164C extending between ends 164A and 164B. Sensing bars 156 and 158 are substantially parallel to each other with sensing coil 160 disposed between intermediate portions 162C and 164C of bars 156 and 158, respectively, and supported by a plastic or other electrically insulating member.

Sensing bar 158, but not sensing bar 156, extends through power coil core opening 144. Therefore, sensing bars 156 and 158 operate as a current divider with sensing bar 158 acting as a current shunt. First ends 162A and 164A of sensing bars 156 and 158, respectively, are electrically connected and second ends 162B and 164B of sensing bars 156 and 158, respectively, are electrically connected, so that intermediate portions 162C and 164C of sensing bars 156 and 158 are connected in parallel. Aluminum or other nonmagnetic straps 166 connect the respective ends 162A and 164A, and 162B and 164B.

Respective first ends 162A and 164A of bars 156 and 158 are electrically connected to a conductor bar 168 and respective second ends 162B and 164B of conductor bars 156 and 158 are connected to another conductor bar (not shown in FIG. 8). Each conductor bar is connected to the power line so that the parallel combination of bars 156 and 158 is electrically connected in series with the power line. Current sensor 140 thus operates as a current divider, with sensing bar 156 serving as a primary winding for current sensor 140, and is smaller, and requires less power consumption than, the current sensors previously described.

Figure 9:
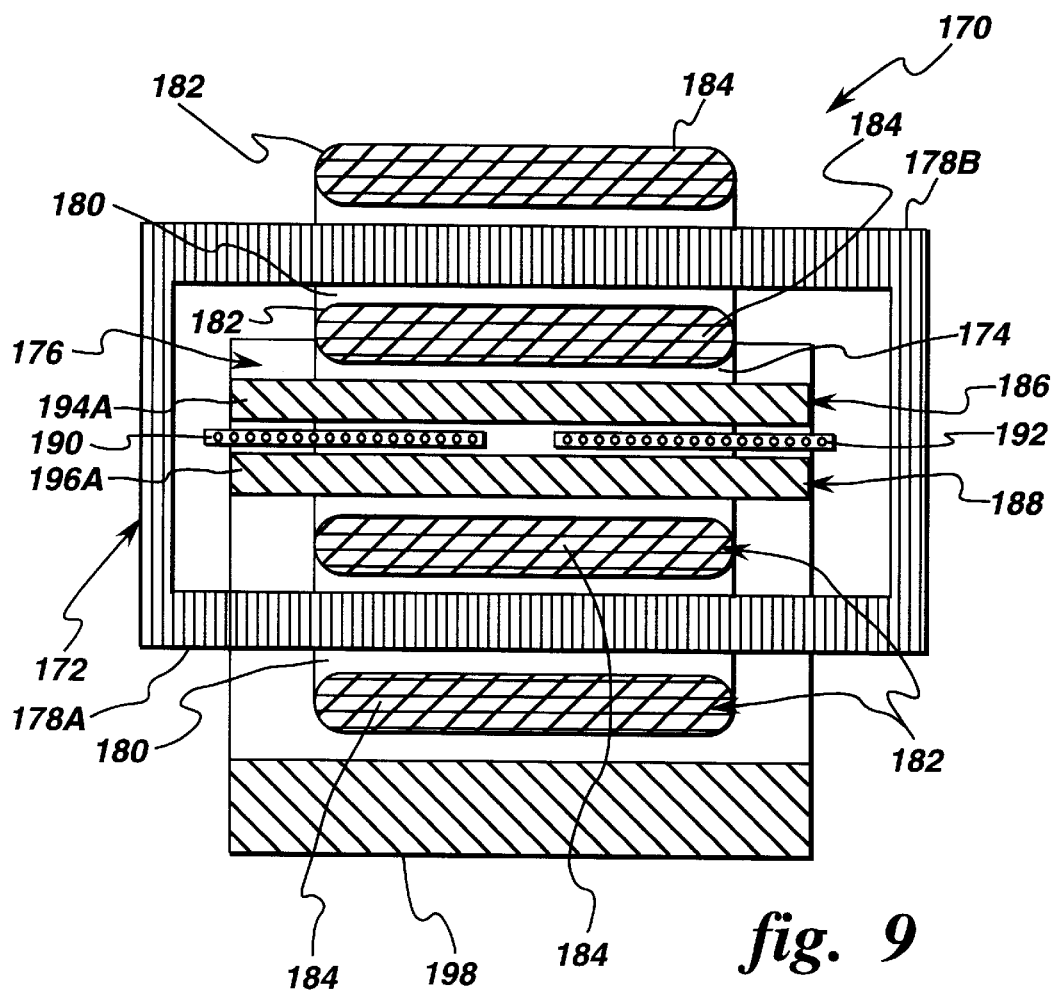
FIG. 9 is an end cross sectional view of a self powered parallel bar current sensor in accordance with an additional embodiment of the present invention.

FIG. 9 is an end cross sectional view of yet another embodiment of a self powered parallel bar current sensor 170, and includes a power coil core 172 of magnetic material having a power coil core opening 174 extending therethrough, and a current sensing element 176. Power coil core 172 includes separate c-cores 178A and 178B held together by straps (not shown) of aluminum or other non-magnetic material. C-cores 178A and 178B are, for example, formed of a plurality of iron laminations, and extend through longitudinal bores 180 in power coil bobbins 182. Power windings 184 on power coil bobbins 182 form a power coil. Power coil bobbins 182 are formed of electrically insulating material such as plastic.

Current sensing element 176 includes two sensing bars 186 and 188, and two sensing coils 190 and 192. Sensing coil 190 is referred to herein as a reference coil. Sensing bar 186 has a first end 194A, a second end 194B, and an intermediate portion 194 C extending between ends 194A and 194B (only end 194A is visible in FIG. 9). Similarly, sensing bar 188 has a first end 196A, a second end 196B, and an intermediate portion 196C extending between ends 196A and 196B (only end 196A is visible in FIG. 9). Sensing bars 186 and 188 are substantially parallel to each other, with reference coil 190 and sensing coil 192 disposed between bars 186 and 188, respectively.

Sensing bars 186 and 188, reference coil 190, and sensing coil 192 extend through power coil core opening 174. Respective first ends 194A and 196A of bars 186 and 188 are electrically connected to a conductor bar 198 which is electrically connected to, for example, a power line (not shown in FIG. 9). The respective second ends of bars 186 and 188 are similarly connected to another conductor bar (not shown in FIG. 9) which also is electrically connected to the power line. Sensing bars 186 and 188 are thus electrically connected in parallel, and the parallel combination of sensing bars is electrically connected in series with the power line. Current sensing element 176 thus serves as a primary winding for current sensor 170.

C-cores 178A and 178B are secured together by aluminum or other non-magnetic straps. Reference coil 190 is supported, for example, by an electrically insulating material, such as plastic, and sensing coil 192 similarly is supported, for example, by a plastic support (not shown in FIG. 9).

Figure 10:
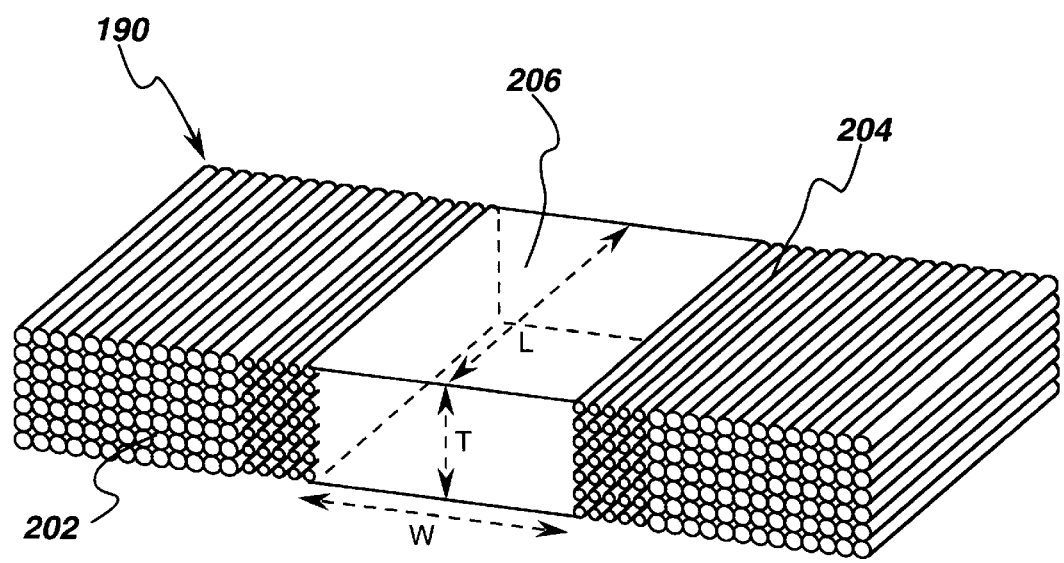
FIG. 10 is a cross sectional view of the current sensing coil in accordance with the current sensors shown in FIGS. 2, 5, 7, and 8.

FIG. 10 is a cross sectional view of reference coil 190, which may be utilized with any of the current sensors described above. The reference coil 190 constitutes an assembly of a sensing coil portion 202, a feedback coil portion 204, and a sensing bobbin 206. Sensing coil portion 202 and feedback coil portion 204 are wound about sensing bobbin 206 so that feedback coil portion 204 is between sensing bobbin 206 and sensing coil portion 202. Sensing bobbin 206 is formed of electrically insulating material such as plastic, and has a length, L, a width, W, and a thickness, T.

Figure 11:
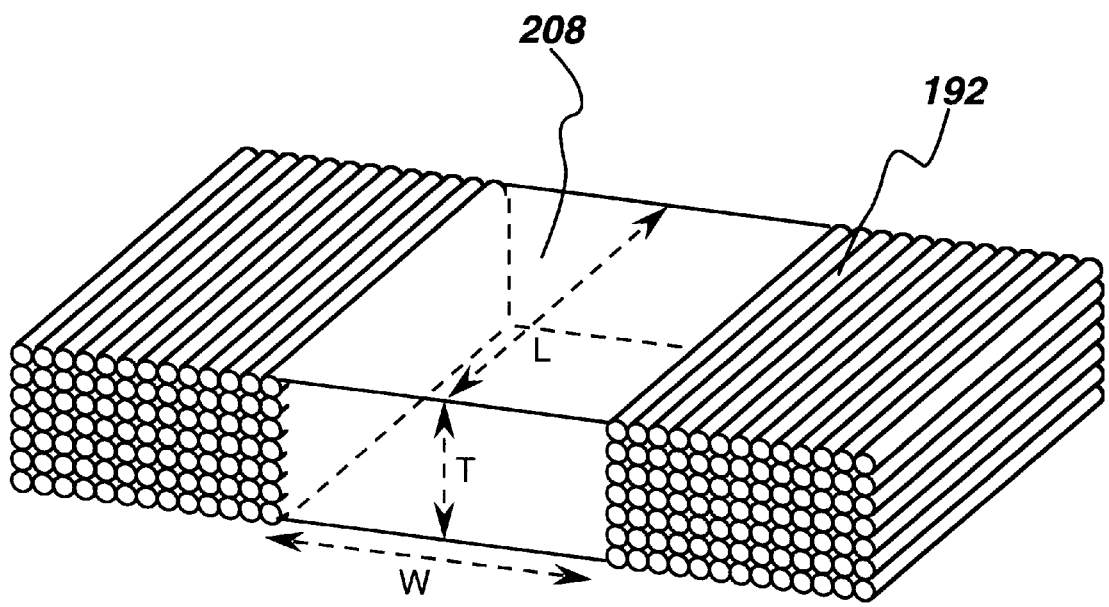
FIG. 11 is a perspective view of the reference coil shown in FIG. 8.

FIG. 11 is a perspective view of sensing coil 192, in accordance with one embodiment of the invention, in which the sensing coil is wound about a bobbin 208 having a length, L, a width, W, and a thickness, T. Bobbin 208 is formed of electrically insulating material such as plastic.

To monitor current in a power line with current sensor 170 (FIG. 9), the power line is electrically coupled to parallel bars 186 and 188 so that sensor 170 is electrically connected in series with the power line. The magnetic field generated by current in parallel bars 186 and 188 induces a voltage in power windings 184, in current sensing coil 192 and in reference coil 190. The voltages induced in current sensing coil 192 and reference coil 190 are provided to an active sensing circuit (not shown) which generates an output signal that may be used for controlling the power system. The sensing circuit may include, for example, a high gain differential amplifier such as amplifier 34 shown in FIG. 1.

Figure 13:
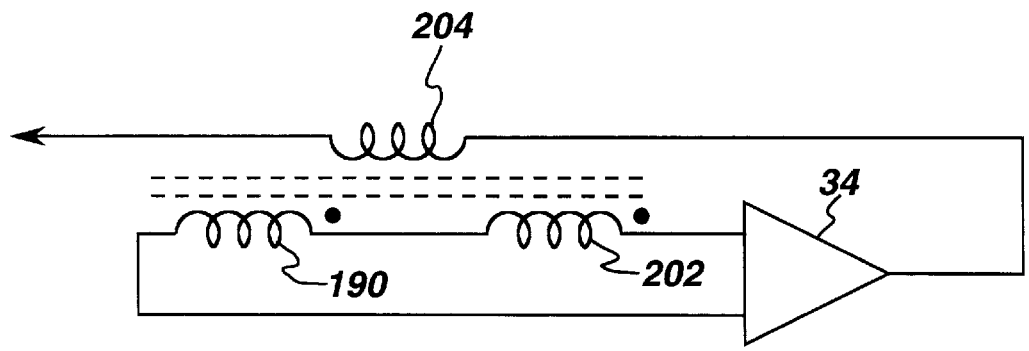
FIG. 13 is a circuit schematic diagram of the self-powered parallel bar current sensor shown in FIG. 9.

More specifically, sensing coil portion 202 of coil 190 is connected in series aiding fashion with coil 192 (FIG. 11) in current sensor 170 of FIG. 9, in order to perform as a sensing coil. Because voltages of opposite polarities are produced in coil 190 and coil portion 202, this series connection produces the difference of the voltages in coils 190 and 192, and this voltage difference is applied to the input of an amplifier, such as amplifier 34 in FIG. 1, in a manner similar to the connection of sensing coil 26 in FIG. 1 to amplifier 34. Feedback coil portion 204 of coil 190 is connected to the output of the amplifier, and corresponds in function to that of feedback coil 28 in FIG. 1. The connections to the amplifier are such that the magnetic flux created in feedback coil portion 204 of coil 190 cancels the time rate of change of magnetic flux sensed by the connection of sensing coils 190 and 192, and the feedback coil 28 output current thus represents a scaled version of the input alternating current. This configuration is shown in circuit schematic form in FIG. 13.

The current induced in power windings 184 is used to energize the sensing circuit components. For example, power windings 184 may be electrically coupled to a power rectifier and control circuit, the output of which may be used to supply power to other components of the circuit.

While only certain preferred features of the invention have been illustrated and described, many modifications and changes will occur to those skilled in the art. It is, therefore, to be understood that the appended claims are intended to cover all such modifications and changes as fall within the true spirit of the invention.

What is claimed is:

1. A self powered parallel bar current sensor for sensing current from a line current source, said bar current sensor comprising:
   a power coil core having a power coil core opening extending therethrough; and
   a current sensing element comprising two substantially parallel sensing bars and a sensing coil, each of said sensing bars having a first end electrically connected to each other and a second end electrically connected to each other, at least one of sensing bars extending through said power coil core opening, said sensing coil positioned between said sensing bars;
   said current sensing element being adapted to be electrically coupled to said line current source, said sensing bars further being disposed with respect to said power coil such that current passing through said current sensing bars induces a voltage in said power coil, said power coil being electrically coupled to energize at least one sensing circuit component.

2. A self powered parallel bar current sensor in accordance with claim 1 wherein each of said sensing bars extends through said power coil core opening.

3. A self powered parallel bar current sensor in accordance with claim 1 wherein said power coil core further comprises a plurality of laminations.

4. A self powered parallel bar current sensor in accordance with claim 3 wherein said power coil core further comprises at least one power coil bobbin, one of said laminations extending through said bobbin.

5. A self powered parallel bar current sensor in accordance with claim 1 wherein said sensing element further comprises a reference coil, said reference coil extending through said opening adjacent said sensing coil.

6. A self powered parallel bar current sensor in accordance with claim 5 wherein said sensing coil comprises an assembly including a sensing coil portion, a feedback coil portion, and a sensing bobbin, said assembly being wound about said bobbin so that said feedback coil portion is between said sensing bobbin and said sensing coil portion.

7. A self powered parallel bar current sensor in accordance with claim 6 including an amplifier having an input coupled to said sensing coil portion and an output coupled to said feedback coil portion, said sensing coil portion being connected in series with said reference coil in a manner to provide the difference of voltages between said sensing coil portion and said reference coil.

8. A current sensing element for a current sensor for sensing current from a line current source, said current sensor including a power coil core having a power core opening extending therethrough, said current sensing element comprising:
   two sensing bars;
   each of said sensing bars having a first end and a second end, said first end of one of said sensing bars being secured to said first end of the other of said sensing bars, and said second end of one of the sensing bars being secured to said second end of the other of said sensing bars;
   each of said sensing bars further having an intermediate segment, said respective intermediate segments being aligned along a respective axis oriented in a common direction such that the intermediate segments are disposed substantially parallel but separated from one another by a space; and
   a sensing coil positioned between the sending bars, at least one of said sensing bars extending through the power coil core opening.

9. A current sensing element in accordance with claim 8 wherein both of said sensing bars extend through the power coil core opening.

10. A current sensing element in accordance with claim 8 wherein said sensing coil extends through the power coil core opening.

11. A current sensing element in accordance with claim 8 further comprising a reference coil situated adjacent said sensing coil.

12. A current sensing element in accordance with claim 8 wherein said sensing coil comprises an assembly including a sensing coil portion, a feedback coil portion, and a sensing bobbin, said assembly being wound about said bobbin so that said feedback coil portion is between said sensing bobbin and said sensing coil portion.

13. A method for assembling a current sensor for measuring current in a line source, the sensor including a power coil core having a power coil opening extending therethrough, and a sensing element including two substantially parallel sensing bars and a sensing coil, said method comprising the steps of:
   positioning one of the parallel sensing bars to extend through the power coil opening;
   electrically connecting a first end of each of said parallel bars to each other;
   electrically connecting a second end of each of said parallel sensing bars to each other; and
   positioning the sensing coil between the parallel sensing bars;
   electrically coupling said power coil to at least one sensing circuit component such that current passing through said current sensing bars induces a voltage in said power coil to energize said at least one sensing circuit component.

14. A method in accordance with claim 13 including the additional step of positioning the other of the parallel sensing bars to extend through the power coil opening.

15. A method in accordance with claim 13, wherein the step of electrically connecting a first end of each of said parallel sensing bars to each other comprises electrically connecting the respective first ends of each of said parallel sensing bars to a first conductor bar; and wherein the step of electrically connecting a second end of each of said parallel sensing bars to each other comprises electrically connecting the respective second ends of each of said parallel sensing bars to a second conductor bar.

16. A method in accordance with claim 13 wherein the sensing element further includes a reference coil, and wherein said method further comprises the step of positioning the reference coil between the parallel sensing bars.

* * * * *